United States Patent [19]

Hoffman et al.

[11] 4,445,968

[45] May 1, 1984

[54] SURFACE TREATMENT FOR CERAMICS TO ELIMINATE ALPHA PARTICLE EMITTING ELEMENTS

[75] Inventors: Herman S. Hoffman, Milton; Robert T. Howard, Jr., Essex Junction, both of Vt.

[73] Assignee: International Business Machines Corporation, Armonk, N.Y.

[21] Appl. No.: 513,580

[22] Filed: Jul. 14, 1983

[51] Int. Cl.$^3$ .................. B44C 1/22; C03C 15/00; C03C 25/06

[52] U.S. Cl. ................................. 156/657; 65/31; 156/663; 156/667

[58] Field of Search ............... 156/654, 657, 663, 667; 252/79.3; 65/31

[56] References Cited

FOREIGN PATENT DOCUMENTS 55-143052  11/1980  Japan .

OTHER PUBLICATIONS

Article by James A. Woolley et al. entitled "Low Alpha-Particle-Emitting Ceramics: What's the Lower Limit?", Published in IEEE Transactions on Components, Hybrids, ... vol. CHMT-2, No. 4, Dec. 1979, pp. 388–390.

Article by H. P. Gibbons et al. entitled "Alpha Particle Emissions of Some Materials in Electronic Packages", Published in IEEE 29th, 1979, pp. 257–260.

Primary Examiner—William A. Powell
Attorney, Agent, or Firm—George Tacticos

[57] ABSTRACT

A method of treating ceramic materials used in semiconductor packaging applications to reduce their emission of alpha particles. Ceramic materials made of aluminum oxide particles bonded together with a siliceous binding material, are etched to remove the siliceous material from a surface portion of the ceramic. Since the typically used siliceous materials have alpha particle emitting elements in them by removing this siliceous material from a surface layer of the ceramic material the sources of alpha particles which are most likely to cause failures in electronic devices are removed. Alpha particle sources deeper in the ceramic pose a far lesser threat to the device because these relatively low energy, high volume particles suffer a substantial attenuation as they pass through aluminum oxide particles.

9 Claims, No Drawings

SURFACE TREATMENT FOR CERAMICS TO ELIMINATE ALPHA PARTICLE EMITTING ELEMENTS

DESCRIPTION

1. Technical Field

This invention relates in general to a method of treating the surface of ceramic materials used in semiconductor packaging applications to remove from them alpha particle emitting elements and more particularly it relates to a method of removing from a surface layer of the ceramic some of its siliceous material which contains alpha particle emitting elements.

2. Background

Ceramic materials used to make semiconductor device packages are typically made of metallic oxide (such as aluminum oxide) particles bonded together by a siliceous material. When a semiconductor device is enclosed into a package made at least in part from such a material, it is safe from alpha particles emanating from sources outside the package, because alpha particles cannot go through a ceramic material having the thickness of a typical ceramic layer presently used for semiconductor packaging applications. However, a device in such a package is a target for alpha particles emanating from sources within the package which are in line of sight to the active surface of the device. It has been discovered that alpha particles emanating from sources within the ceramic package have caused failures in devices, such as memories, which are sensitive to such bombardments.

An alpha particle is essentially a helium (He) atom with two of its electrons removed. This relatively heavy and strongly ionizing particle is emitted during the decay of several radioactive isotopes, such as $Bi^{210}$, $Po^{210}$, $U^{238}$ and $Th^{232}$. Such isotopes exist naturally, as impurities, in many of the raw materials that are used to make the ceramic packaging materials. The alpha particles produced from these isotopes have a spectrum of energies, typically in a range of 2 to 9 MeV and a relatively large volume so they are easily attenuated as they move through ceramic materials or the silicon substrates of semiconductor devices. Therefore from the alpha particles produced inside a ceramic substrate only those particles that are produced close to the surface of the substrate and on the line of sight of an active device region have the potential to produce a device failure. Other package materials are considerably less likely to emit the alpha particles in a direction that will cause a device to fail than the large ceramic plates parallel to the active device surface.

Thus far most efforts to solve the problems caused by the alpha particle emissions from ceramic packages have been directed towards improving the purity of the raw materials used to make the ceramic and towards developing methods for coating the critical surfaces of the ceramic package with a coating material that does not emit or allow the easy passage of alpha particles through it.

A more detailed discussion of the problems associated with the alpha particles emitted from the ceramic materials is contained in an article by James A. Woolley et at, entitled "Low Alpha-Particle-Emitting Ceramics: What's The Lower Limit?" published in IEEE Transactions on Components, Hybrids and Manufacturing Technology, Vol. CHMT-2, No. 4, pages 388-390, December 1979 and an article by H. P. Gibbons and J. D. Pittman entitled "Alpha Particle Emissions of Some Materials in Electronic Packages," published in IEEE 29th Electronics Components Coference of May 1979, pages 257-260.

While efforts to improve the purity and quality of the raw materials used to make ceramic packages may in the future result in ceramic packages with fewer sources of alpha particles, there is a present need to make packages with presently available ceramic materials that do not cause the enclosed devices to fail. Furthermore, the use of coating materials to cover critical ceramic surfaces, provides only a temporary and often unsatisfactory solution to the problem of protecting devices from alpha particle bombardments. For example, the long term stability of the presently used silicone coating materials is uncertain and the difficulty in preventing voids in such materials raises questions on whether such coatings provide a satisfactory solution to the problem of protecting the devices from the alpha particle bombardments emanating from the ceramic package of the device.

DISCLOSURE OF THE INVENTION

It is an object of this invention to provide a method for treating ceramic packaging materials to remove from them alpha particle emitting elements.

It is another object of this invention to provide a method for removing from portions of the ceramic package materials sources of alpha particles.

It is yet another object of this invention to provide a method for eliminating alpha particle emitting elements from a ceramic packaging material which ceramic material includes relatively large particles of aluminum oxide ($Al_2O_3$) bonded together by a siliceous material.

In accordance with the teachings of this invention, a method is provided for reducing alpha particle emissions from a ceramic packaging material, which material includes particles of a metallic oxide, such as aluminum oxide ($Al_2O_3$), bonded together by a siliceous material which contains in it alpha particle emitters. This method reduces the alpha particle emissions from the ceramic material by removing through etching from a surface layer of the ceramic material the siliceous material and the alpha particle emitters contained in it. An etching solution that will remove the siliceous material without removing the aluminum oxide particles is a solution containing hydrofluoric acid (HF) as the etching medium.

In one embodiment of the method in accordance with the teachings of this invention, ceramic substrates made from $Al_2O_3$ particles, bonded together by a siliceous material, are immersed in a solution consisting of seven (7) parts of deionized water and one (1) part of concentrated hydrofluoric acid. The substrates are placed in the solution and kept immersed it it for about one hour. An adequate flow of the solution is provided during the processing and the solution is maintained at an ambient temperature. The substrates are them removed from the solution, rinsed in deionized water and air dried.

This step removes from the ceramic substrates the superficial siliceous layer around the surface of the substrate and some of the siliceous binding material from between the top-most layer of the $Al_2O_3$ grains while keeping the main portions of these particles embedded in the substrate. These residual $Al_2O_3$ grains then become the attenuating barrier for those alpha particles emitted from deeper lying sources. The alpha particle penetration range for particle energies between 2 to 9 MeV (which includes the major portion of the energy spectrum) is 25 to 30 μm of $Al_2O_3$. Thus, a grain size larger than ASTM-no. 7.5 (with "diameter" of average grain section of 25 μm as shown in Table 2 of the 1980 Annual ASTM Standards, part 11, page 202) will effectively screen and keep the alpha particles from coming through the substrate. Smaller grain sizes will effect a smaller attenuation but will still attenuate and reduce the number of particles that could cause a nearby active device region to fail.

Removing a siliceous material of between 5 to 15 μm will result in the removal of a substantial number of alpha particle emitters which would normally emit particles that could impinge an active device surface and produce failures.

While the invention has been described in connection with a preferred embodiment, it will be understood that is is not intended to limit the invention to the specific embodiment described herein. On the contrary, it is intended to cover all alternatives, modifications and equivalents, as may be included within the spirit and scope of the invention as defined by the appended claims.

What is claimed is:

1. A method of reducing alpha particle emissions from a ceramic packaging material, wherein said ceramic material includes particles of metallic oxides bonded together by a siliceous material, and wherein alpha particle emitters are contained in said siliceous material, which method comprises removing from a surface layer of said ceramic material a predetermined amount of said siliceous material and thereby removing said alpha particle emitters contained therein.

2. A method as set forth in claim 1 wherein said particles of metallic oxides are particles of aluminum oxide.

3. A method as set forth in claim 2 wherein said surface layer has a thickness between 5 and 15 μm.

4. A method as set forth in claim 3 wherein said siliceous material is removed by treating said surface layer of said ceramic material with an etching solution containing hydrofluoric acid.

5. A method as set forth in claim 4 wherein said etching solution contains seven parts water and one part hydrofluoric acid.

6. A method of treating ceramic substrates used in semiconductor device packaging to reduce their emission of alpha particles wherein said ceramic substrates include particles of aluminum oxide bonded together by a siliceous material and wherein alpha particle emitters are contined in said siliceous material, which method comprises removing from a surface layer of said substrate close to said semiconductor device a predetermined portion of said siliceous material to remove said alpha particle emitters contained therein.

7. A method as set forth in claim 6 wherein said step or removing said siliceous material includes etching said material with an etching solution containing hydrofluoric acid.

8. A method of treating a ceramic substrate to reduce its alpha particle emissions, wherein said ceramic substrate includes particles of $Al_2O_3$ bonded together by a siliceous material, which method comprises removing a predetermined portion of said siliceous material from exposed areas of said substrate and from areas between said particles of $Al_2O_3$ to remove said sources of alpha particles contained therein while keeping the main portion of said particles embedded in said substrate.

9. A method as set forth in claim 8 wherein:
said step of removing said siliceous material is accomplished by etching said material with an etching solution containing hydrofluoric acid; and
said portion of said siliceous material that is removed is sufficient to cause the removal of sources of alpha particles in the siliceous material from which alpha particles can exit said substrate without passing through said particles of $Al_2O_3$, while keeping the main portions of said particles embedded within said substrate.

* * * * *